(12) United States Patent
Klaba et al.

(10) Patent No.: US 11,644,254 B2
(45) Date of Patent: May 9, 2023

(54) THERMAL TRANSFER DEVICE HAVING A FLUID CONDUIT

(71) Applicant: OVH, Roubaix (FR)

(72) Inventors: Henri Klaba, Roubaix (FR); Ali Chehade, Templeuve (FR); Hadrien Bauduin, Villeneuve d'Ascq (FR); Angelos Lyris, Toulouse (FR)

(73) Assignee: OVH, Roubaix (FR)

( * ) Notice: Subject to any disclaimer, the term of this patent is extended or adjusted under 35 U.S.C. 154(b) by 30 days.

(21) Appl. No.: 17/176,454

(22) Filed: Feb. 16, 2021

(65) Prior Publication Data
US 2021/0164738 A1 Jun. 3, 2021

Related U.S. Application Data

(63) Continuation of application No. 16/546,785, filed on Aug. 21, 2019, now abandoned.

(30) Foreign Application Priority Data

Sep. 4, 2018 (EP) .................................... 18315027

(51) Int. Cl.
| | |
|---|---|
| *H05K 7/20* | (2006.01) |
| *F28F 13/12* | (2006.01) |
| *F28F 13/06* | (2006.01) |
| *F28F 13/08* | (2006.01) |

(52) U.S. Cl.
CPC ............. *F28F 13/06* (2013.01); *F28F 13/08* (2013.01); *F28F 13/12* (2013.01); *F28F 2250/102* (2013.01); *F28F 2250/108* (2013.01); *H05K 7/20254* (2013.01)

(58) Field of Classification Search
CPC .......... F28F 3/12; F28F 13/12; F28F 2210/02; F28F 2210/10; F28F 2250/102; H05K 7/20254

See application file for complete search history.

(56) References Cited

U.S. PATENT DOCUMENTS

| | | | |
|---|---|---|---|
| 2,471,960 A * | 5/1949 | Johnson | ................... F25B 39/04 |
| | | | 165/170 |
| 2,900,175 A * | 8/1959 | McGuffey | ................. F28F 3/12 |
| | | | 165/170 |
| 4,817,707 A | 4/1989 | Aoyama et al. | |
| 5,239,200 A | 8/1993 | Messina et al. | |

(Continued)

FOREIGN PATENT DOCUMENTS

| | | |
|---|---|---|
| CN | 103066727 A | 4/2013 |
| CN | 203559978 U | 4/2014 |

(Continued)

OTHER PUBLICATIONS

European Search Repod with regard to the counterpad EP Patent Application No. 18315027.5 completed Feb. 12, 2019.

(Continued)

*Primary Examiner* — Leonard R Leo
(74) *Attorney, Agent, or Firm* — BCF LLP

(57) ABSTRACT

A thermal transfer device has a body and a fluid conduit defined in the body. The body has a thermal transfer surface configured to be placed in contact with a target component. The fluid conduit is configured for conveying fluid through the body and is thermally coupled to the thermal transfer surface.

15 Claims, 8 Drawing Sheets

(56) References Cited

U.S. PATENT DOCUMENTS

| | | | |
|---|---|---|---|
| 5,320,164 | A | 6/1994 | Szczesuil et al. |
| 5,562,156 | A | 10/1996 | Ogawa et al. |
| 6,066,408 | A * | 5/2000 | Vitale .................. F28D 9/0075 |
| | | | 429/456 |
| 6,309,773 | B1 | 10/2001 | Rock |
| 6,420,061 | B1 | 7/2002 | Fujii et al. |
| 6,655,449 | B1 | 12/2003 | Hsien |
| 6,719,039 | B2 | 4/2004 | Calaman et al. |
| 6,841,287 | B2 | 1/2005 | Farkash |
| 7,694,723 | B2 | 4/2010 | Ma et al. |
| 7,779,898 | B2 | 8/2010 | Morrison et al. |
| 2002/0110723 | A1 | 8/2002 | Farkash |
| 2002/0185260 | A1 | 12/2002 | Calaman et al. |
| 2005/0092468 | A1 | 5/2005 | Cheng et al. |
| 2005/0128705 | A1 * | 6/2005 | Chu ...................... H01L 23/473 |
| | | | 361/699 |
| 2006/0118279 | A1 | 6/2006 | Stafford |
| 2006/0162899 | A1 | 7/2006 | Huang et al. |
| 2006/0266498 | A1 | 11/2006 | Liu et al. |
| 2007/0089858 | A1 | 4/2007 | Andberg et al. |
| 2007/0102146 | A1 | 5/2007 | Scott |
| 2007/0124934 | A1 | 6/2007 | Peng |
| 2007/0163270 | A1 | 7/2007 | Chien et al. |
| 2007/0209784 | A1 | 9/2007 | Peng |
| 2008/0024990 | A1 | 1/2008 | Peng et al. |
| 2009/0059528 | A1 | 3/2009 | Damsohn et al. |
| 2009/0323286 | A1 | 12/2009 | Han |
| 2011/0088881 | A1 * | 4/2011 | Yang ........................ F28D 7/08 |
| | | | 165/157 |
| 2011/0168360 | A1 | 7/2011 | Chang et al. |
| 2012/0055654 | A1 | 3/2012 | Katsumata et al. |
| 2016/0227672 | A1 | 8/2016 | Lin |
| 2016/0330868 | A1 | 11/2016 | Sun et al. |
| 2017/0115071 | A1 | 4/2017 | Lin |
| 2017/0215301 | A1 | 7/2017 | Zheng et al. |
| 2018/0100703 | A1 | 4/2018 | Beaver et al. |

FOREIGN PATENT DOCUMENTS

| | | | |
|---|---|---|---|
| CN | 104699209 | A | 6/2015 |
| CN | 105159421 | A | 12/2015 |
| CN | 105683696 | A | 6/2016 |
| CN | 206160430 | U | 5/2017 |
| CN | 207602727 | U | 7/2018 |
| DE | 3933956 | A1 | 4/1991 |
| DE | 102007017623 | A1 * | 10/2008 ........... H01L 23/473 |
| DE | 202016105911 | U1 | 11/2016 |
| DE | 202016106303 | U1 | 11/2016 |
| DE | 202016106304 | U1 | 11/2016 |
| EP | 1967808 | A1 | 9/2008 |
| EP | 2171373 | A1 | 4/2010 |
| EP | 2629041 | A2 | 8/2013 |
| EP | 3089210 | A1 | 11/2016 |
| FR | 2989481 | A1 | 10/2013 |
| JP | S6113575 | A | 1/1986 |
| WO | 2009013130 | A1 | 1/2009 |
| WO | 2016/191881 | A1 | 12/2016 |

OTHER PUBLICATIONS

English Abstract for DE202016105911 retrieved on Espacenet dated Aug. 19, 2019.

English Abstract for DE202016106303 retrieved on Espacenet dated Aug. 19, 2019.

Pop, "EK Launches Water Block for NVIDIA's GeForce GTX 980 Graphics Card—Gallery", 2014, https://news.softpedia.com/news/EK-Launches-Water-Block-for-NVIDIA-s-GeForce-GTX-980-Graphics-Card-Gallery-459290.shtml, pdf 3 pages.

"AquaGraFX GTX 680 Water Block Announced", 2012, https://whatswithjeff.com/aquagrafx-gtx-680-water-block-announced/, pdf 3 pages.

"EK Water Blocks EK-FC480 GTX—Plexi NVIDIA GTX480 GPU Water Block", Overclock, http://www.overclock.co.uk/product/EK-Water-Blocks-EK-FC480-GTX-Plexi-NVIDIA-G, pdf 3 pages.

"EK prepping Radeon HD 5870 waterblock", https://www.dvhardware.net/article38118.html, pdf 2 pages.

"The Personal Company Era (2004-2007)", https://www.ekwb.com/company-history/2004-2007/, pdf 8 pages.

"AquaComputer AquagratiX 5870 GPU Water Block", http://www.pureoverclock.com/Review-detail/aquacomputer-aquagratix-5870-gpu-water-block/, pdf 2 pages.

Kirsch, "Aqua Computers Announces GeForce GTX 1080 and GTX 1070 Kryographics Water Blocks", 2016, https://www.legitreviews.com/182230_182230, pdf 4 pages.

"A Trip Down Memory Lane", ProCooling, 2005, http://www.procooling.com/index.php?func=articles&disp=142, pdf 3 pages.

"Dangerden Maze 4 Review", ProCooling, 2004, http://www.procooling.com/index.php?func=articles&disp=82, pdf 3 pages.

"CPU Water Block 3D CAD Model Library GrabCAD", https://grabcad.com/library/cpu-water-block, pdf pages.

English Abstract for CN104699209 retrieved on Espacenet dated Aug. 19, 2019.

English Abstract for FR2989481 retrieved on Espacenet dated Aug. 19, 2019.

Office Action with regard to the counterpart CN Patent Application No. 201910822579.2 dated Oct. 28, 2021 and English Translation.

English Abstract for CN105159421 retrieved on Espacenet dated Nov. 25, 2021.

English Abstract for CN206160430 retrieved on Espacenet dated Nov. 25, 2021.

English Abstract for CN203559978 retrieved on Espacenet dated Nov. 25, 2021.

English Abstract for CN207602727 retrieved on Espacenet dated Nov. 25, 2021.

English Abstract for CN103066727 retrieved on Espacenet dated Nov. 25, 2021.

English Abstract for CN105683696 retrieved on Espacenet dated Nov. 25, 2021.

* cited by examiner

THERMAL TRANSFER DEVICE HAVING A FLUID CONDUIT

CROSS-REFERENCE

The present application is a continuation of U.S. patent application Ser. No. 16/546,785, filed on Aug. 21, 2019, which claims priority from European Patent Application No. 1 831 5027.5 filed on Sep. 4, 2018, the entirety of each of which is incorporated herein by reference.

FIELD OF TECHNOLOGY

The present technology relates to thermal transfer devices having a fluid conduit.

BACKGROUND

Heat dissipation is an important consideration for computer systems. Notably, many components of a computer system, such as a processor (also referred to as central processing unit (CPU)), generate heat and thus require cooling to avoid performance degradation and, in some cases, failure. Moreover, with advancing technological progress, processors are not only becoming more performant but also have a greater associated thermal design power (TDP) (i.e., a maximum amount of heat generated thereby which a cooling system should dissipate).

Many solutions exist for promoting heat dissipation in computer systems. Amongst them are heat sinks which rely on a heat transfer medium (e.g., a gas or liquid) to carry away the heat generated by a particular component of the computer system. For instance, a water block, which is a watercooling heat sink, is thermally coupled to the component to be cooled (e.g., the processor) and water is circulated through a conduit in the water block to absorb the heat from the component. As water flows out of the water block, so does the heat absorbed thereby.

However, water blocks are susceptible to clogging and, in some cases, can be expensive to produce as manufacturing thereof can be time-consuming. In addition, the increasing cooling requirements of processors and other such components pose a challenge to water blocks. Moreover, conventional water blocks are typically efficient only when operating with a relatively high water flow rate and at high pressure and thus require a pump system (for feeding water to the water block) with an accordingly high static head.

There is therefore a desire for a thermal transfer device which can alleviate at least some of these drawbacks.

SUMMARY

It is an object of the present technology to ameliorate at least some of the inconveniences present in the prior art.

According to one aspect of the present technology, there is provided a water block for cooling one of a central processing unit (CPU) and a graphics processing unit (GPU) of a computer system, the water block comprising:

a body having a thermal transfer surface configured to be placed in contact with the one of the CPU and the GPU;

a fluid conduit defined in the body and configured for conveying fluid through the body, the fluid conduit being thermally coupled to the thermal transfer surface, the fluid conduit having an inlet and an outlet, the fluid conduit being configured so that:

at a first junction, the fluid conduit branches into a first channel and a second channel which extend adjacent and generally parallel to one another along an initial portion of the fluid conduit;

the first and second channels diverge away from one another at an end of the initial portion such that each of the first and second channels forms a serpentine path, the serpentine path formed by the first channel extending toward a first direction, the serpentine path formed by the second channel extending toward a second direction generally opposite to the first direction;

the first and second channels merge at a second junction; and each of the first and second channels defines a sinusoidal pattern along at least a majority of a span thereof.

According to another aspect of the present technology, there is provided a thermal transfer device. The thermal transfer device includes a body having a thermal transfer surface configured to be placed in contact with a target component. The thermal transfer device also includes a fluid conduit defined in the body and configured for conveying fluid through the body. The fluid conduit is thermally coupled to the thermal transfer surface. The fluid conduit has an inlet and an outlet. The fluid conduit is configured so that: at a first junction, the fluid conduit branches into a first channel and a second channel which extend adjacent and generally parallel to one another along an initial portion of the fluid conduit; the first and second channels diverge away from one another at an end of the initial portion such that each of the first and second channels forms a serpentine path, the serpentine path formed by the first channel extending toward a first direction, the serpentine path formed by the second channel extending toward a second direction generally opposite to the first direction; and the first and second channels merge at a second junction.

In some embodiments, the first junction is the inlet of the fluid conduit.

In some embodiments, the second junction is the outlet of the fluid conduit.

In some embodiments, each of the first and second channels defines a sinusoidal pattern along at least a majority of a span thereof.

In some embodiments, a width of each of the first and second channels is constant.

In some embodiments, the width of each of first and second channels is between 1 mm and 4 mm inclusively.

In some embodiments, the serpentine path formed by each of the first and second channels defines a plurality of longitudinally-extending sections that are parallel to one another and laterally spaced from one another.

In some embodiments, the plurality of longitudinally-extending sections includes an innermost longitudinally-extending section that is closest to the first junction and an outermost longitudinally-extending section that is furthest from the first junction.

In some embodiments, the inlet is located centrally between the outermost longitudinally-extending section of the first channel and the outermost longitudinally-extending section of the second channel.

In some embodiments, the outlet is laterally aligned with the inlet.

In some embodiments, the first and second channels extend in opposite directions from the second junction.

In some embodiments, the body has a first body portion and a second body portion affixed to the first body portion. The fluid conduit is defined by the first and second body portions. A path of each of the first and second channels is defined by the first body portion.

In some embodiments, the inlet and the outlet are defined in the second body portion.

In some embodiments, the first and second body portions are welded to one another.

In some embodiments, the thermal transfer device is a water block.

In some embodiments, the water block is generally rectangular.

Embodiments of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of embodiments of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where.

DETAILED DESCRIPTION

Figure 1:
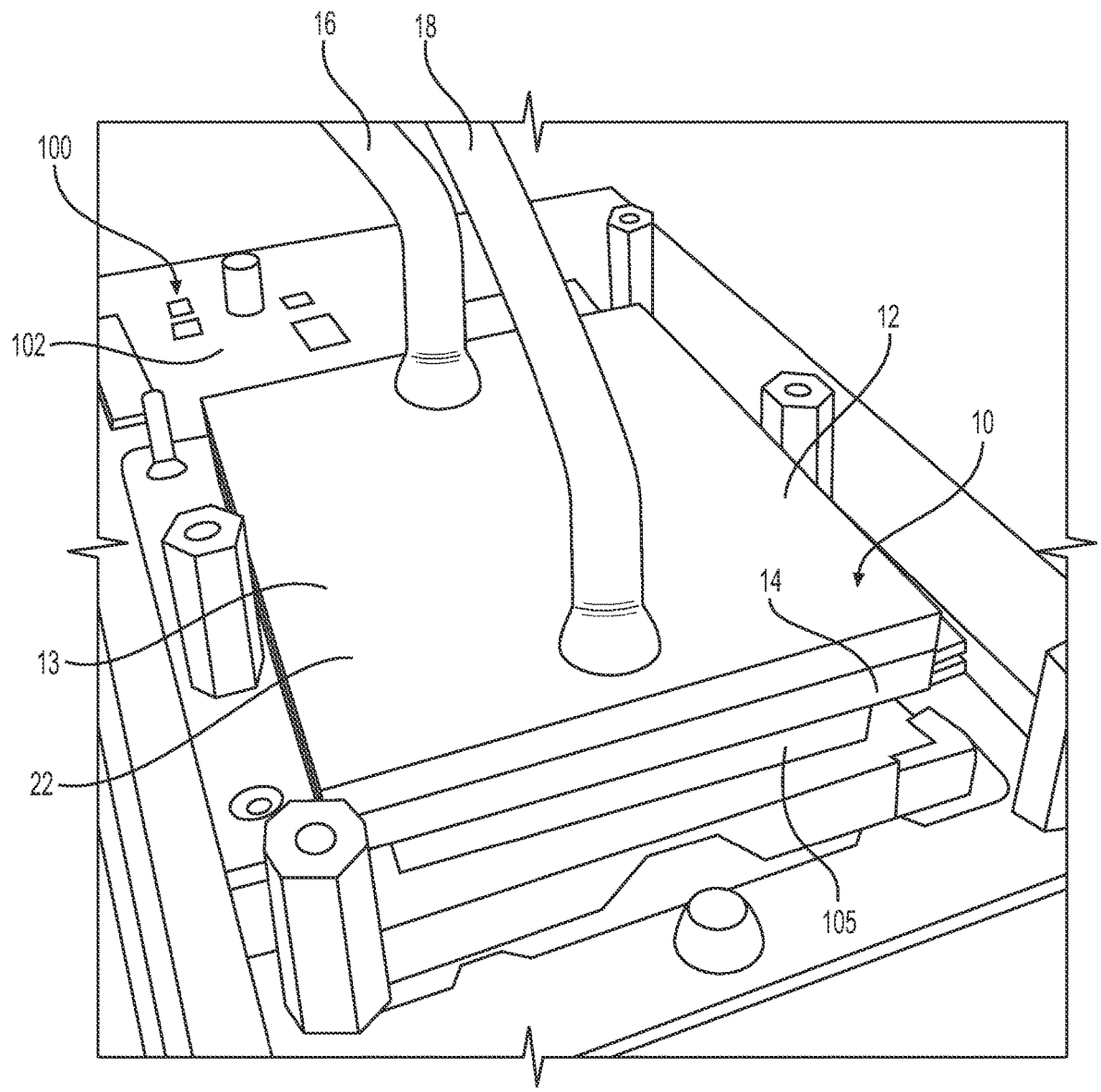
FIG. 1 is a perspective view of a thermal transfer device thermally coupled to a processor of a computer system.

FIG. 1 illustrates a thermal transfer device 10 for cooling a target component 105. In this example, the target component 105 is a central processing unit (CPU) of a computer system 100 and is mounted to a motherboard 102 thereof. In use, the CPU 105 generates a significant amount of heat and, as is known, can benefit from cooling. It is contemplated that the target component 105 could be any other suitable heat-generating component (e.g., a graphics processing unit (GPU)) or an intermediary component disposed between the thermal transfer device 10 and a heat-generating component. As will be described in detail below, in this embodiment, the thermal transfer device 10 is a water block (i.e., a heat sink that uses water as a fluid medium for transferring heat) and will be referred to as such herein. It is nevertheless contemplated that a fluid other than water could be used in other embodiments.

The water block 10 has a body 12 including two body portions 13, 14 that are affixed to one another. The body portions 13, 14 may be thought of as a cover 13 and a base 14 respectively. The body 12 (as well as each of the cover 13 and the base 14 thereof) is rectangular, with the cover 13 and the base 14 having identical lengths and widths such that, when the cover 13 is secured to the base 14, as shown in FIG. 1, the ends of the cover 13 and the base 14 are substantially flush with one another. In this embodiment, the cover 13 and the base 14 are made of copper and are welded to one another. More specifically, the cover 13 is soldered onto the base 14. In other embodiments, the cover 13 and the base 14 could be cold-welded or laser-welded together. The welding of the cover 13 and the base 14 prevents fluid leaks from the water block 10 without using any sealing members (e.g., a packing). Moreover, welding of the cover 13 and the base 14 allows using fewer elements such as screws or other fasteners for holding the cover 13 and the base 14 together.

Figure 2:
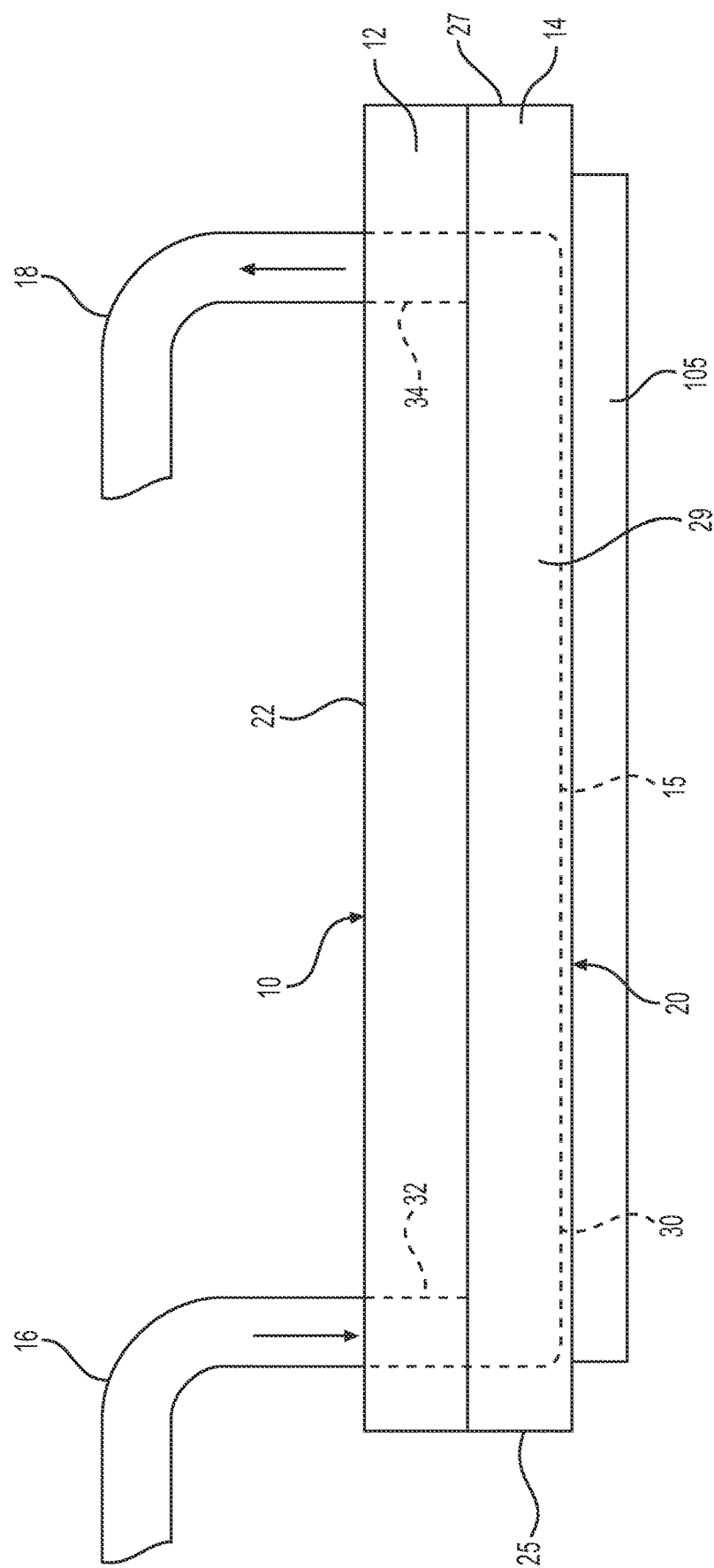
FIG. 2 is a right side elevation view of the thermal transfer device of FIG. 1 coupled to the processor.

The water block 10 is thermally coupled to the CPU 105 for cooling thereof. More specifically, the body 12 has an external thermal transfer surface 20 (which is a lower surface of the base 14) that is placed in contact with the CPU 105. As shown in FIG. 2, the thermal transfer surface 20 is placed in contact with an upper surface of the CPU 105 to absorb heat therefrom. In some cases, a thermal paste may be disposed between the thermal transfer surface 20 and the CPU 105, applied to the thermal transfer surface 20 or the upper surface of the CPU 105, to improve heat transfer therebetween by ensuring continuity of contact between the thermal transfer surface 20 and the upper surface of the CPU 105. Any other medium with adequate thermal conductivity for ensuring continuity of contact between the thermal transfer surface 20 and the upper surface of the CPU 105 may be used instead of the thermal paste in other cases.

The water block 10 has a fluid conduit 30 defined in the body 12 for conveying water therethrough. More specifically, the fluid conduit 30 is defined by surfaces of both the cover 13 and the base 14. Notably, a continuous recess 15 formed in the upper surface 24 of the base 14 defines a path describes by the fluid conduit 30.

The fluid conduit 30 is thermally coupled to the thermal transfer surface 20 such that, when water flows in the fluid conduit 30, heat absorbed by the thermal transfer surface 20 is subsequently absorbed by water flowing in the fluid conduit 30. Water is received into the fluid conduit 30 via an inlet 32 and expelled therefrom via an outlet 34. Both the inlet 32 and the outlet 34 are defined in the cover 13 (i.e., water enters and exits the body 12 via the cover 13). As shown in FIGS. 1 and 2, the inlet 32 is fluidly connected to a tube 16 through which water is fed into the fluid conduit 30. Similarly, a tube 18 is fluidly connected to the outlet 34 to discharge water from the fluid conduit 30. In this embodiment, the tubes 16, 18 are copper tubes and are welded to the outer surface 22 of the body 12 (i.e., an outer surface of the cover 13).

The fluid conduit 30 describes a path from the inlet 32 to the outlet 34 such as to guide the flow of water along the path. As will be described in greater detail below, the particular path described by the fluid conduit 30 may provide more efficient cooling of the CPU 105.

Figure 3:
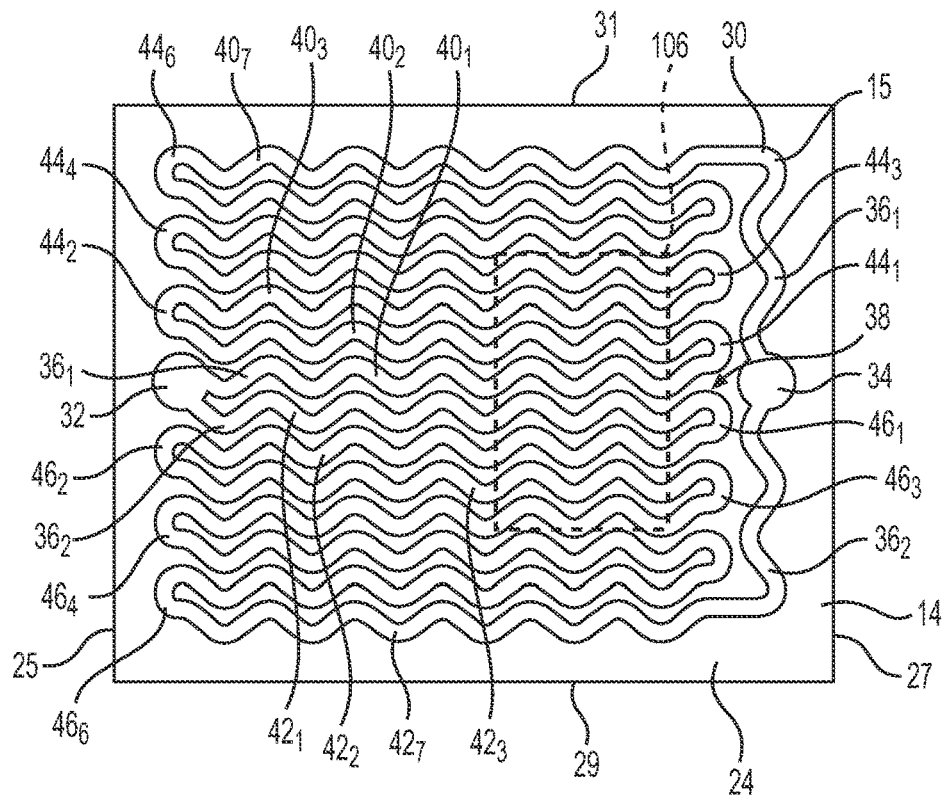
FIG. 3 is top plan view of a base of the thermal transfer device of FIG. 1, showing a fluid conduit thereof.

The path described by the fluid conduit 30 begins at the inlet 32 thereof which is laterally centered on the water block 10. That is, as best seen in FIG. 3, the inlet 32 is located centrally between the lateral ends of the water block 10 (and thus the lateral ends 29, 31 of the base 14). The fluid conduit 30 branches into two channels $36_1$, $36_2$ at the inlet 32 such that the flow of fluid within the fluid conduit 30 is split between both channels $36_1$, $36_2$. This may promote laminar flow of fluid within the fluid conduit 30 which reduces pressure drop of the fluid as it flows through the fluid conduit 30. As will be described further below, the channels $36_1$, $36_2$ merge together again at the outlet 34. However, in the span of the fluid conduit 30 between the inlet 32 and the outlet 34, the channels $36_1$, $36_2$ are fluidly separate from one another such that water flow from both channels $36_1$, $36_2$ does not mix until reaching the outlet 34.

It is contemplated that, in alternative embodiments, the junction at which the fluid conduit 30 branches into the two channels $36_1$, $36_2$ could be at a location other than the inlet 32. For example, the fluid conduit 30 could branch into the two channels $36_1$, $36_2$ at a junction downstream from the inlet 32 (i.e., a location, along the path of the fluid conduit 30, further from the inlet 32). Similarly, it is contemplated that, in alternative embodiments, the junction at which the two channels $36_1$, $36_2$ merge together could be upstream from the outlet 34.

In this embodiment, the path of the fluid conduit 30 (including the path of each of the channels $36_1$, $36_2$) is defined by the base 14 independently of the cover 13. In other words, while the cover 13 defines part of the fluid conduit 30 (covering an open top thereof), the direction of the water flow within the fluid conduit 30 is defined by the recess 15 machined into the upper surface 24 of the base 14. For its part, the cover 13 has a lower flat surface that closes the open top of the recess 15 (except at the inlet 32 and the outlet 34).

The channels $36_1$, $36_2$ extend adjacent and parallel to one another along an initial portion 38 of the fluid conduit 30 beginning at the junction at which the channels $36_1$, $36_2$ begin (i.e., at the inlet 32 in this embodiment). The initial portion 38 is the portion of the fluid conduit 30 along which the channels $36_1$, $36_2$ are closest to one another aside from when the channels $36_1$, $36_2$ merge again at the outlet 34. At an end of the initial portion 38, the channels $36_1$, $36_2$ diverge from one another such that each of the channels $36_1$, $36_2$ forms a "serpentine" path. The serpentine paths of the channels $36_1$, $36_2$ extend toward generally opposite lateral directions (i.e., one extends toward the lateral end 29 while the other extends toward the opposite lateral end 31). A serpentine path is herein defined as being a path that describes at least one S-shaped curve. More specifically, the serpentine path formed by each of the channels $36_1$, $36_2$ includes a plurality of longitudinally-extending sections that extend generally longitudinally and which are connected by looping sections. For instance, the channel $36_1$ has a plurality of longitudinally-extending sections $40_1$-$40_7$ that are parallel to one another and are laterally spaced from one another, with adjacent ones of the longitudinally-extending sections $40_1$-$40_7$ being connected by looping sections $44_1$-$44_6$. The longitudinally-extending section $40_1$ is an innermost one of the longitudinally-extending sections $40_1$-$40_7$ (i.e., furthest away from the lateral end 31) and is part of the initial portion 38. The longitudinally-extending section $40_7$ is an outermost one of the longitudinally-extending sections $40_1$-$40_7$ (i.e., closest to the lateral end 31).

Similarly, the channel $36_2$ has a plurality of longitudinally-extending sections $42_1$-$42_7$ that are parallel to one another, with adjacent ones of the longitudinally-extending sections $42_1$-$42_7$ being connected by looping sections $46_1$-$46_6$. The longitudinally-extending section $42_1$ is an innermost one of the longitudinally-extending sections $42_1$-$42_7$ (i.e., furthest away from the lateral end 29) and part of the initial portion 38. The longitudinally-extending section $42_7$ is an outermost one of the longitudinally-extending sections $42_1$-$42_7$ (i.e., closest to the lateral end 29).

As will be noted, the longitudinally-extending sections $40_1$-$40_7$, $42_1$-$42_7$ of the channels $36_1$, $36_2$ have approximately the same length. This spreads the heat transfer capability more evenly throughout the thermal transfer surface 20 of the water block 10.

The innermost longitudinally-extending sections $40_1$, $42_1$ of the channels $36_1$, $36_2$ extend adjacent and parallel to one another along the initial portion 38 of the fluid conduit 30. As such, the innermost longitudinally-extending sections $40_1$, $42_1$ are laterally aligned with the inlet 32 which, as mentioned above, is laterally centered between the lateral ends 29, 31 of the base 14 (and thus the lateral ends of the water block 10). The inlet 32 is also located centrally between the outermost longitudinally-extending section $40_7$ of the channel $36_1$ and the outermost longitudinally-extending section $42_7$ of the channel $36_2$.

In this embodiment, each of the channels $36_1$, $36_2$ defines a sinusoidal pattern along a majority of a span thereof. That is, each one of the channels $36_1$, $36_2$ has a repetitive pattern approximating that of a sinusoidal function along at least half of the span of that channel $36_1$, $36_2$. In this case, the sinusoidal pattern is defined along the longitudinally-extending portions $40_1$-$40_7$, $42_1$-$42_7$ of the serpentine paths formed by the channels $36_1$, $36_2$. The sinusoidal pattern defined by the channels $36_1$, $36_2$ changes a direction of the flow of water within the channels $36_1$, $36_2$ as the flow of water engages the curves defined by the sinusoidal pattern. Moreover, it is noted that the channels $36_1$, $36_2$ have a constant width (i.e., a distance between the opposite walls of each of the channels $36_1$, $36_2$ is uniform along a span thereof) as the width is unaffected by the curves defined by the sinusoidal pattern.

In particular, in this embodiment, the width of each of the channels $36_1$, $36_2$ is approximately 2 mm. In other embodiments, the width of each of the channels $36_1$, $36_2$ may be between 1 mm and 4 mm inclusively. This relatively large width of the channels $36_1$, $36_2$ allows using simple and fast manufacturing methods to produce the water block 10 in contrast with some conventional water blocks having "micro" channels made via electrical discharge machining. Notably, the channels $36_1$, $36_2$ of the water block 10 can be machined (e.g., via a mill) with a tool having an adequate diameter. Therefore, this results in a more economic manufacturing process for producing the water block 10. Moreover, the relatively large width of the channels $36_1$, $36_2$ may be helpful to restrict pressure drop of the water flow within the channels $36_1$, $36_2$, as well as to limit fouling of the channels $36_1$, $36_2$.

The channels $36_1$, $36_2$ may have any other suitable dimensions in other embodiments, so long as it is convenient for the flow regime within the channels $36_1$, $36_2$ and easily machinable such as with a machine tool having a rotary cutter (e.g., a mill or a router).

The sinusoidal pattern defined by the channels $36_1$, $36_2$ advantageously increases the contact area of the walls thereof compared to if the channels $36_1$, $36_2$ were linear (i.e., straight). This increased contact area results in improved heat transfer. The sinusoidal pattern also creates flow disturbances leading to greater friction between the water and the walls of the channels $36_1$, $36_2$ which also improves heat transfer therebetween and, moreover, limits the fouling rate and clogging within the channels $36_1$, $36_2$, while generating a limited increase of pressure drop compared to if the channels $36_1$, $36_2$ were linear.

At the end of the outermost longitudinally-extending sections $40_7$, $42_7$ (i.e., the respective ends of the outermost longitudinally-extending sections $40_7$, $42_7$ closest, along the fluid conduit 30, to the outlet 34), the channels $36_1$, $36_2$ diverge to extend generally laterally (i.e., perpendicular to the outermost longitudinally-extending sections $40_7$, $42_7$) toward one another and then merge at the outlet 34. As such, the channels $36_1$, $36_2$ extend in opposite directions from the outlet 34. It is noted that the outlet 34 is laterally aligned with the inlet 32 such that the outlet 34 is laterally centered between the ends 29, 31 of the base 14.

It is contemplated that, in alternative embodiments, the junction at which the two channels $36_1$, $36_2$ merge could be at a location other than the outlet 34. For example, the two channels $36_1$, $36_2$ could merge at a junction upstream from the outlet 34 (i.e., a location, along the path of the fluid conduit 30, further from the outlet 34).

The above-described configuration of the fluid conduit 30 allows routing relatively cool water to a target area 106, as shown in FIG. 3. The target area 106 corresponds to a hottest zone of the CPU 105. That is, the target area 106 is an area of the water block 10 which, when the water block 10 is installed on the CPU 105, overlies a point of the CPU 105 that exhibits a highest temperature during operation. As such, the target area 106 can benefit from being exposed to water that is as cool as possible.

To that end, a distance along the fluid conduit 30 between the inlet 32 and the target area 106 is made relatively small since the inlet 32 is where water flowing within the fluid conduit 30 is coldest because heat has not yet substantially been transferred to the water. In particular, the inlet 32 is located centrally between the lateral ends 29, 31 such as to be laterally aligned with the target area 106 and thus be relatively close thereto while at the same time allowing the fluid conduit 30 to overlap a majority of the area of the thermal transfer surface 20. The initial portion 38, which is the portion of the fluid conduit 30 along which water flowing in the fluid conduit 30 is coldest due to its proximity to the inlet 32, overlaps the target area 106 such as to bring the cool water from the inlet 32 to the target area 106 relatively quickly before the water absorbs a substantial amount of heat. In contrast, in many conventional water block configurations, the inlet and the outlet of the fluid conduit are located at opposite corners of the water block and thus the water travels a substantial distance (e.g., in a serpentine path) before it gets to the area corresponding to the hottest zone of the CPU or other component to be cooled. As such, by the time the originally cool water gets to the area that corresponds to the hottest zone of the CPU, a substantial amount of heat has already been transferred to the water thus making it less efficient at absorbing heat from the hottest zone of the CPU.

This configuration of the fluid conduit 30, and those described below with respect to other embodiments thereof, allows the water block 10 to operate efficiently at a relatively low flow rate and low pressure, with limited pressure drop in the water flow. Moreover, due the lower flow rate and pressure operating parameters of the water block 10, a pump needed for feeding the water block 10 can have a lower static head than if it were used for feeding a conventional water block that operates efficiently only at high flow rate and high pressure. Alternatively or additionally, the lower flow rate and pressure operating parameters of the water block 10 can allow a single pump to simultaneously feed multiple water blocks such as the water block 10. This is particularly useful in cases where multiple components have to be cooled such as, for example, in a data center storing multiple servers that require cooling.

In addition, in an example of implementation such as a data center, the lower flow rate and pressure needed for efficient operation of the water block 10 can also carry over to the water circulation system to which the water block 10 is coupled. Thus, the water flow in the water circulation system is also subject to reduced pressure drop. Moreover, the diameter of the tubing within which the water circulates in the water circulation system of the data center can also be reduced which, while causing an increase in the pressure drop in the water flow, results in a more compact water circulation system that is less costly and easier to install. In addition, a risk of leaks in the water circulation system is also reduced since the water circulation system is less pressurized. Furthermore, due to the lower flow rate, heat collected by the water blocks 10 leads to a temperature increase in the water circulation system which may be more convenient to design and operate the heat exchangers (e.g., chillers, dry coolers, plate heat exchangers) that are coupled to the water circulation system for releasing the heat collected by the water blocks 10. Similarly, this temperature increase in the water circulation system may lead to high outlet temperature, which may ease heat valorization (e.g. heating buildings in the winter). Moreover, in some examples of implementation such as a data center, it is noted that the water block 10 could operate at high inlet temperatures of up to 50° C., whereby water chillers for the water circulation system of the data center can be replaced by more preferable direct cooling solutions (e.g., dry coolers), which reduces costs and energy consumption associated with the implementation of water chillers.

Figure 4:
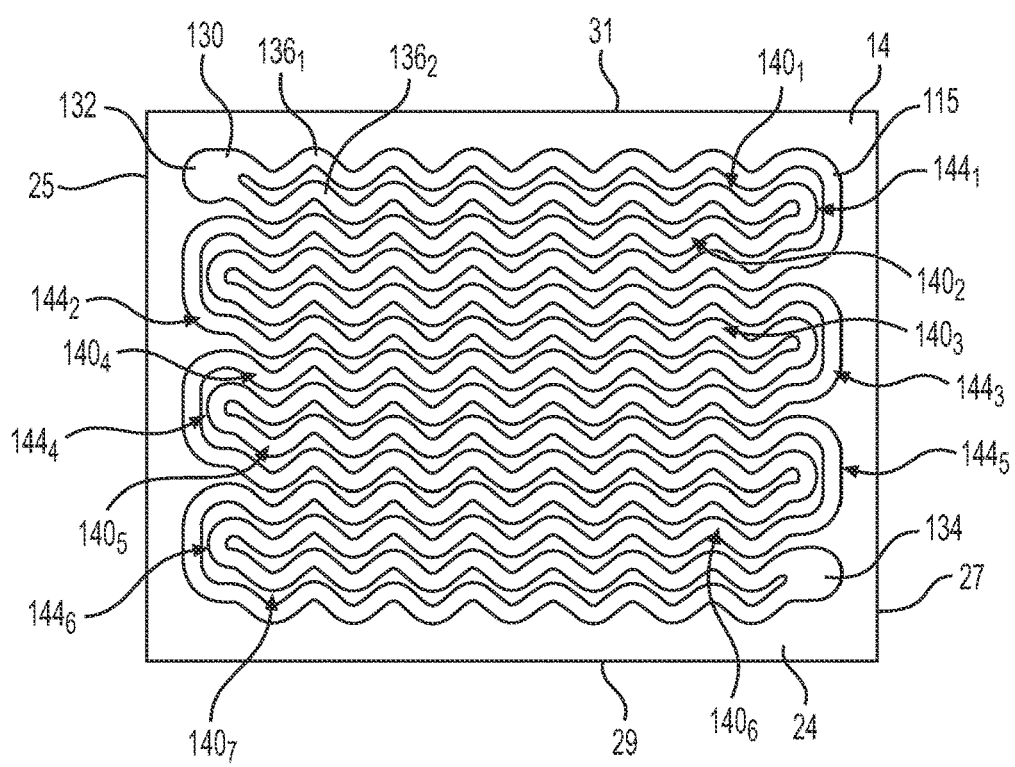
FIG. 4 is a top plan view of the base of the thermal transfer device in accordance with another embodiment in which the fluid conduit is configured differently.

With reference to FIG. 4, an alternative embodiment of the water block 10 will be described. In this embodiment, the fluid conduit 30 of the above-described embodiment is replaced with a fluid conduit 130. As will be noted, the path described by the fluid conduit 130 as defined by the base 14 is different from the fluid conduit 30 described above.

The fluid conduit 130 is thermally coupled to the thermal transfer surface 20 such that, when water flows in the fluid conduit 130, heat absorbed by the thermal transfer surface 20 is subsequently absorbed by water flowing in the fluid conduit 130. Water is received into the fluid conduit 130 via an inlet 132 and expelled therefrom via an outlet 134. Both the inlet 132 and the outlet 134 are defined in the cover 13 (i.e., water enters and exits the body 12 via the cover 13).

The path described by the fluid conduit 130 begins at the inlet 132 thereof which is located generally at a corner of the rectangular water block 10. That is, the inlet 132 is located adjacent an intersection of the longitudinal end 25 and the lateral end 31 of the base 14. The fluid conduit 130 branches into two channels $136_1$, $136_2$ at the inlet 32 such that the flow of fluid within the fluid conduit 130 is split between both channels $136_1$, $136_2$. As discussed above, this may promote laminar flow of fluid within the fluid conduit 130 which reduces pressure drop of the fluid as it flows through the fluid conduit 130. The channels $136_1$, $136_2$ extend parallel to one another along at least a majority of a span of the fluid conduit 130. More specifically, in this embodiment, the channels $136_1$, $136_2$ extend parallel and adjacent to one another from the inlet 132 to the outlet 134. As will be described further below, the channels $136_1$, $136_2$ merge together again at the outlet 134. However, in the span of the fluid conduit 130 between the inlet 132 and the outlet 134, the channels $136_1$, $136_2$ are fluidly separate from one another such that water flow from both channels $136_1$, $136_2$ does not mix until reaching the outlet 134.

It is contemplated that, in alternative embodiments, the fluid conduit 130 could branch into more than two channels. For instance, the fluid conduit could branch into three channels or four channels.

Furthermore, it is contemplated that, in alternative embodiments, the junction at which the fluid conduit 130 branches into the two channels $136_1$, $136_2$ could be at a location other than the inlet 132. For example, the fluid conduit 130 could branch into the two channels $136_1$, $136_2$ at a junction downstream from the inlet 132 (i.e., a location, along the path of the fluid conduit 130, further from the inlet 132). Similarly, it is contemplated that, in alternative embodiments, the junction at which the two channels $136_1$, $136_2$ merge together could be upstream from the outlet 134.

The fluid conduit 130 forms a "serpentine" path. As mentioned above, a serpentine path is herein defined as being a path that describes at least one S-shaped curve. More specifically, the fluid conduit 130 defines a plurality of longitudinally-extending sections $140_1$-$140_7$ that are parallel to one another and are laterally spaced from one another, with adjacent ones of the longitudinally-extending sections $140_1$-$140_7$ being connected by looping sections $144_1$-$144_6$. By extension, the channels $136_1$, $136_2$ of the fluid conduit 130 extend generally parallel to one another along the serpentine path (i.e., along the longitudinally-extending sections $140_1$-$140_7$ and the looping sections $144_1$-$144_6$).

Figure 7:
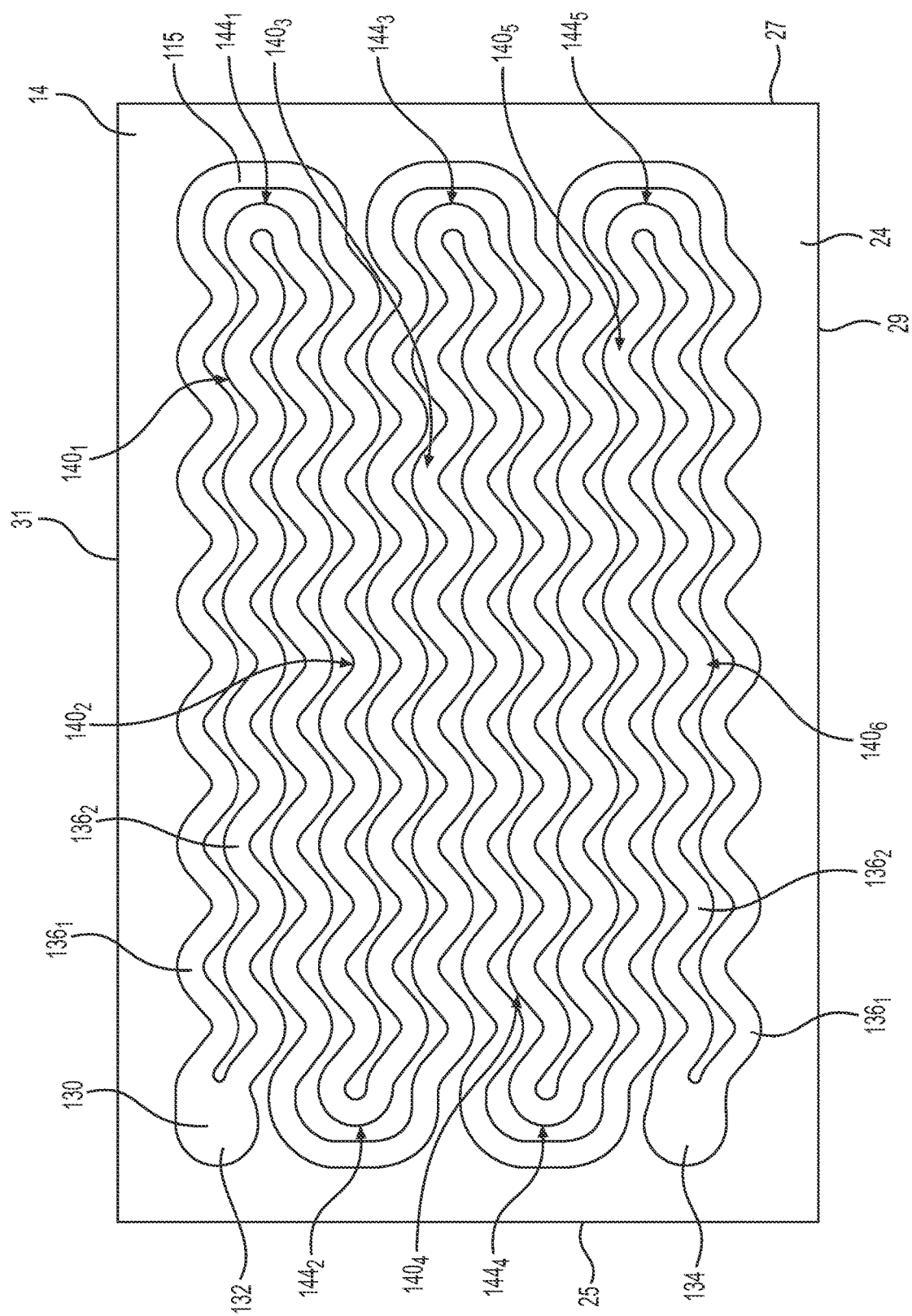
FIG. 7 is a top plan view of the base of the thermal transfer device in accordance with a variant of the embodiment of FIG. 4.

The inlet 132 is located at the longitudinally-extending section $140_1$ and the outlet 134 is located at the longitudinally-extending section $140_7$ such that the inlet 132 and the outlet 134 are located at the laterally furthest-most of the longitudinally-extending sections $140_1$-$140_7$ respectively (i.e., the longitudinally-extending sections $140_1$-$140_7$ which are most laterally spaced from one another). Moreover, the inlet 132 and the outlet 134 are generally located at diagonally opposite corners of the rectangular water block 10 (like illustrated in FIG. 4, with an even number of looping sections $144_1$-$144_6$). Therefore, although not illustrated herein, in this embodiment, the tubes 16, 18 will be connected to the cover 13 at the corresponding diagonally opposite corners (unlike what is illustrated in FIG. 1) to be connected to the inlet 132 and the outlet 134. In alternative embodiments, as shown in FIG. 7, the inlet 132 and the outlet 134 may be located at laterally opposite corners adjacent the same longitudinal end 25. In such embodiments, the number of looping sections $144_x$ would be uneven (see looping sections $144_1$-$144_5$ in FIG. 7).

Figure 8:
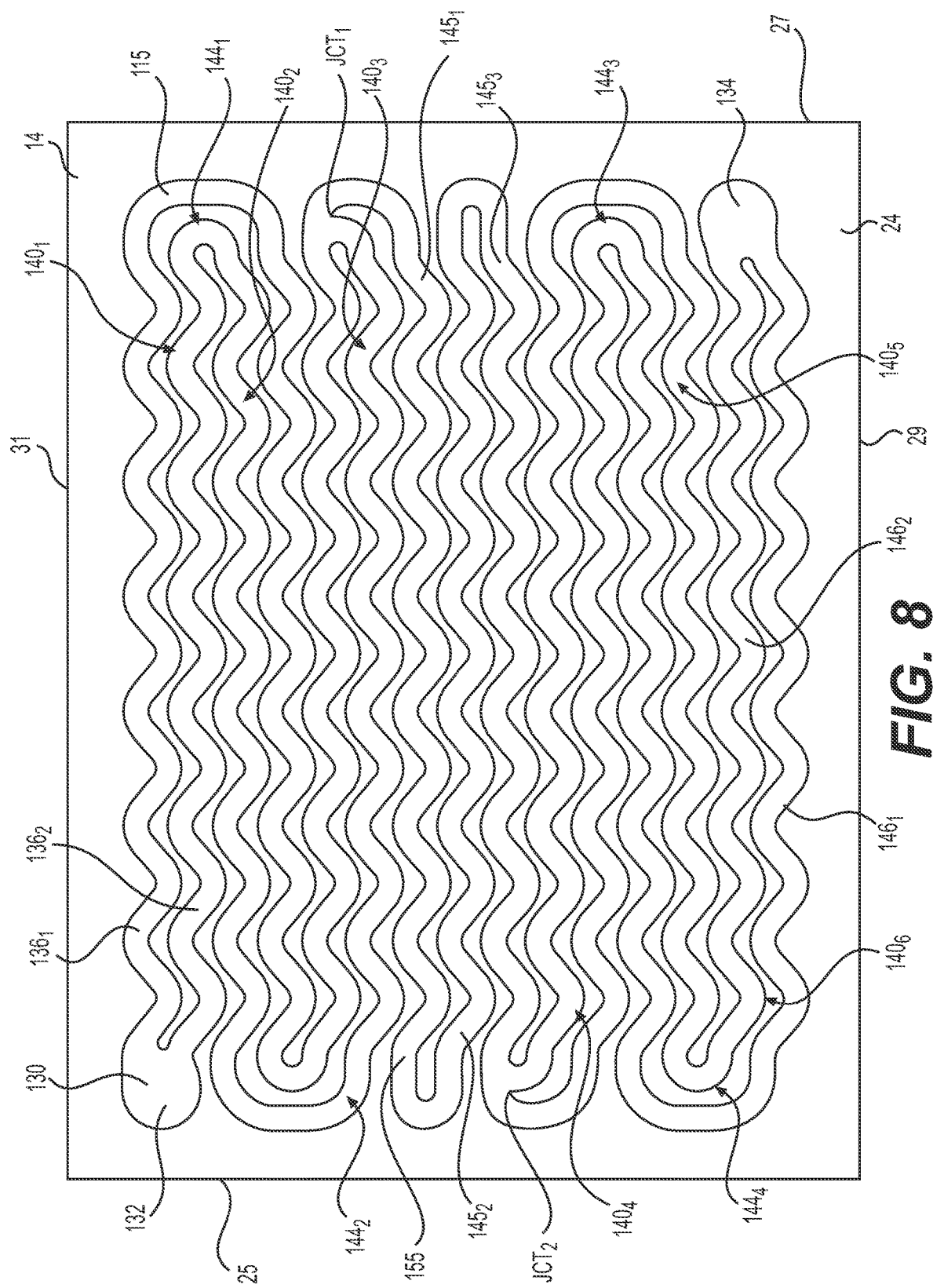
FIG. 8 is a top plan view of the base of the thermal transfer device in accordance with another variant of the embodiment of FIG. 4.

Furthermore, it is contemplated that, in alternative embodiments, the two channels $136_1$, $136_2$ could merge together at an intermediate junction between the inlet 132 and the outlet 134, such that the fluid conduit 130 defines a single channel downstream of the intermediate junction before the fluid conduit 130 splits again into two channels $146_1$, $146_2$. For example, as shown in FIG. 8, the longitudinally-extending sections $140_1$-$140_3$ are positioned, laterally, between the inlet 132 and an intermediate junction $JCT_1$. The two channels $136_1$, $136_2$ extend along each of the longitudinally-extending sections $140_1$-$140_3$ and looping sections $144_1$, $144_2$ interconnecting the longitudinally-extending sections $140_1$-$140_3$. At the intermediate junction $JCT_1$, the two channels $136_1$, $136_2$ merge into a single channel 155 which, alone, defines the path of the fluid conduit 130 from the intermediate junction $JCT_1$ to another intermediate junction $JCT_2$ downstream from the intermediate junction $JCT_1$. The fluid conduit 130 defines a plurality of longitudinally-extending sections $145_1$-$145_3$ that are parallel to one another and laterally spaced from one another, and extending between the intermediate junctions $JCT_1$, $JCT_2$. The single channel 155 extends along the longitudinally-extending sections $145_1$-$145_3$ and the looping sections interconnecting the longitudinally-extending sections $145_1$-$145_3$. The longitudinally-extending sections $145_1$-$145_3$ are substantially laterally centered between the lateral ends 29, 31 and define a limited region of the fluid conduit 130 where heat transfer is prioritized over pressure drop. This may be beneficial for example in cases where heat generation of the CPU 105 is greatest at its center. The fluid conduit 130 again branches into two channels $146_1$, $146_2$ at the intermediate junction $JCT_2$ downstream from the intermediate junction $JCT_1$. Between the intermediate junction $JCT_2$ and the outlet 134, the fluid conduit 130 defines longitudinally-extending sections $140_4$-$140_6$ positioned parallel to one another and laterally spaced from one another, similarly to the previous longitudinally-extending sections $140_1$-$140_3$. The two channels $146_1$, $146_2$ extend along each of the longitudinally-extending sections $140_4$-$140_6$ and looping sections $144_3$, $144_4$ interconnecting the longitudinally-extending sections $140_4$-$140_6$. The two channels $146_1$, $146_2$ are configured similarly to the channels $136_1$, $136_2$—notably, the two channels $146_1$, $146_2$ extend parallel to one another along at least a majority (i.e., a majority or an entirety) of a span thereof and each of the channels $146_1$, $146_2$ also defines a sinusoidal pattern along at least a majority of a span thereof. The channels $146_1$, $146_2$ merge at the outlet 134 downstream from the intermediate junction $JCT_2$. As discussed above with regard to FIG. 4, the outlet 134 is located at a diagonally opposite corner from the inlet 132. In alternative embodiments, the inlet 132 and the outlet 134 may be located at laterally opposite corners adjacent the same longitudinal end 25, as discussed above with regard to FIG. 7.

Each of the channels $136_1$, $136_2$ defines a sinusoidal pattern along a majority of a span thereof. That is, each one of the channels $136_1$, $136_2$ has a repetitive pattern approximating that of a sinusoidal function along at least half of the span of that channel $136_1$, $136_2$. In this case, the sinusoidal pattern is defined along the longitudinally-extending portions $140_1$-$140_7$ of the serpentine path of the fluid conduit 130. The sinusoidal pattern defined by the channels $136_1$, $136_2$ changes a direction of the flow of water within the channels $136_1$, $136_2$ as the flow of water engages the curves defined by the sinusoidal pattern. Moreover, it is noted that the channels $136_1$, $136_2$ have a constant width (i.e., a distance between the opposite walls of each of the channels $136_1$, $136_2$ is uniform along a span thereof) as the width is unaffected by the curves defined by the sinusoidal pattern. In particular, in this embodiment, the width of each of the channels $136_1$, $136_2$ is 2 mm. In other embodiments, the width of the channels of each of the channels $136_1$, $136_2$ may be between 1 mm and 4 mm. The channels $136_1$, $136_2$ may have any other suitable dimensions in other embodiments so long as it is convenient for the flow regime within the channels $136_1$, $136_2$ and easily machinable such as with a machine tool having a rotary cutter (e.g., a mill or a router).

As in the previous embodiment, the fluid conduit 130 is defined by the cover 13 and the base 14 when the cover 13 and the base 14 are affixed to one another. Moreover, in this embodiment, the path of the fluid conduit 130 (including the path of each of the channels $136_1$, $136_2$) is defined by the base 14 independently of the cover 13. In other words, while the cover 13 defines part of the fluid conduit 130 (covering an open top thereof), the direction of the water flow within the fluid conduit 30 is defined by the recess 115 machined into the upper surface 24 of the base 14. For its part, the cover 13 has a lower flat surface that closes the open top of the recess 115 (except at the inlet 132 and the outlet 134).

Figure 5:
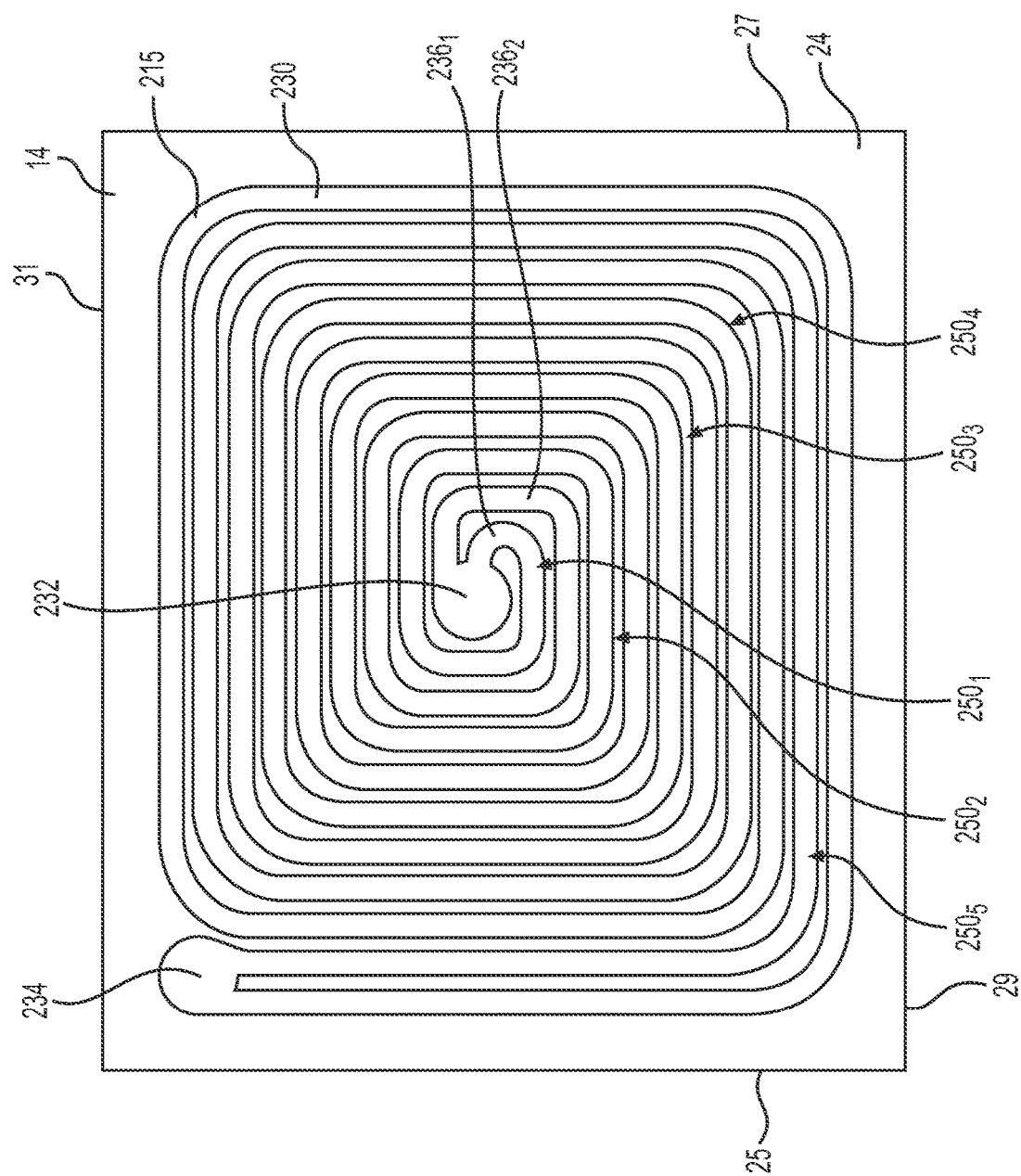
FIG. 5 is a top plan view of the base of the thermal transfer device in accordance with another embodiment in which a path described by the fluid conduit is spiral.

With reference to FIG. 5, another alternative embodiment of the water block 10 will be described. In this embodiment, the fluid conduit 30 is replaced with a fluid conduit 230. As will be noted, the path described by the fluid conduit 230 as defined by the base 14 is different from the fluid conduits 30, 130 described above.

The fluid conduit 230 is thermally coupled to the thermal transfer surface 20 such that, when water flows in the fluid conduit 230, heat absorbed by the thermal transfer surface 20 is subsequently absorbed by water flowing in the fluid conduit 230. Water is received into the fluid conduit 230 via an inlet 232 and expelled therefrom via an outlet 234. Both the inlet 232 and the outlet 234 are defined in the cover 13 (i.e., water enters and exits the body 12 via the cover 13).

The path described by the fluid conduit 230 begins at the inlet 232 thereof which is located generally centrally of the rectangular water block 10 (i.e., laterally and longitudinally centered between the lateral and longitudinal ends thereof). The central position of the inlet 232 allows routing cool water to the center of the water block 10, which may be beneficial if the location of the CPU 105 that is most desired to be cooled is centrally located. Notably, water will be coolest along the fluid conduit 230 at the central inlet 232 (since the water has not yet absorbed heat from circulating through an appreciable span of the fluid conduit 230) and therefore heat transfer at the center of the CPU 105 (i.e., a position aligned with the inlet 232) will be significant.

The fluid conduit 230 branches into two channels $236_1$, $236_2$ at the inlet 232 such that the flow of fluid within the fluid conduit 230 is split between both channels $236_1$, $236_2$. As discussed above, this may promote laminar flow of fluid within the fluid conduit 230 which reduces pressure drop of the fluid as it flows therethrough. The channels $236_1$, $236_2$ extend parallel to one another along at least a majority of a span of the fluid conduit 230. More specifically, in this embodiment, the channels $236_1$, $236_2$ extend parallel from the inlet 232 to the outlet 234. As will be described further below, the channels $236_1$, $236_2$ merge together again at the outlet 234. However, in the span of the fluid conduit 230 between the inlet 232 and the outlet 234, the channels $236_1$, $236_2$ are fluidly separate from one another such that water flow from both channels $236_1$, $236_2$ does not mix until reaching the outlet 234.

It is contemplated that, in alternative embodiments, the fluid conduit 230 could branch into more than two channels. For instance, the fluid conduit could branch into three channels or four channels.

Figure 9:
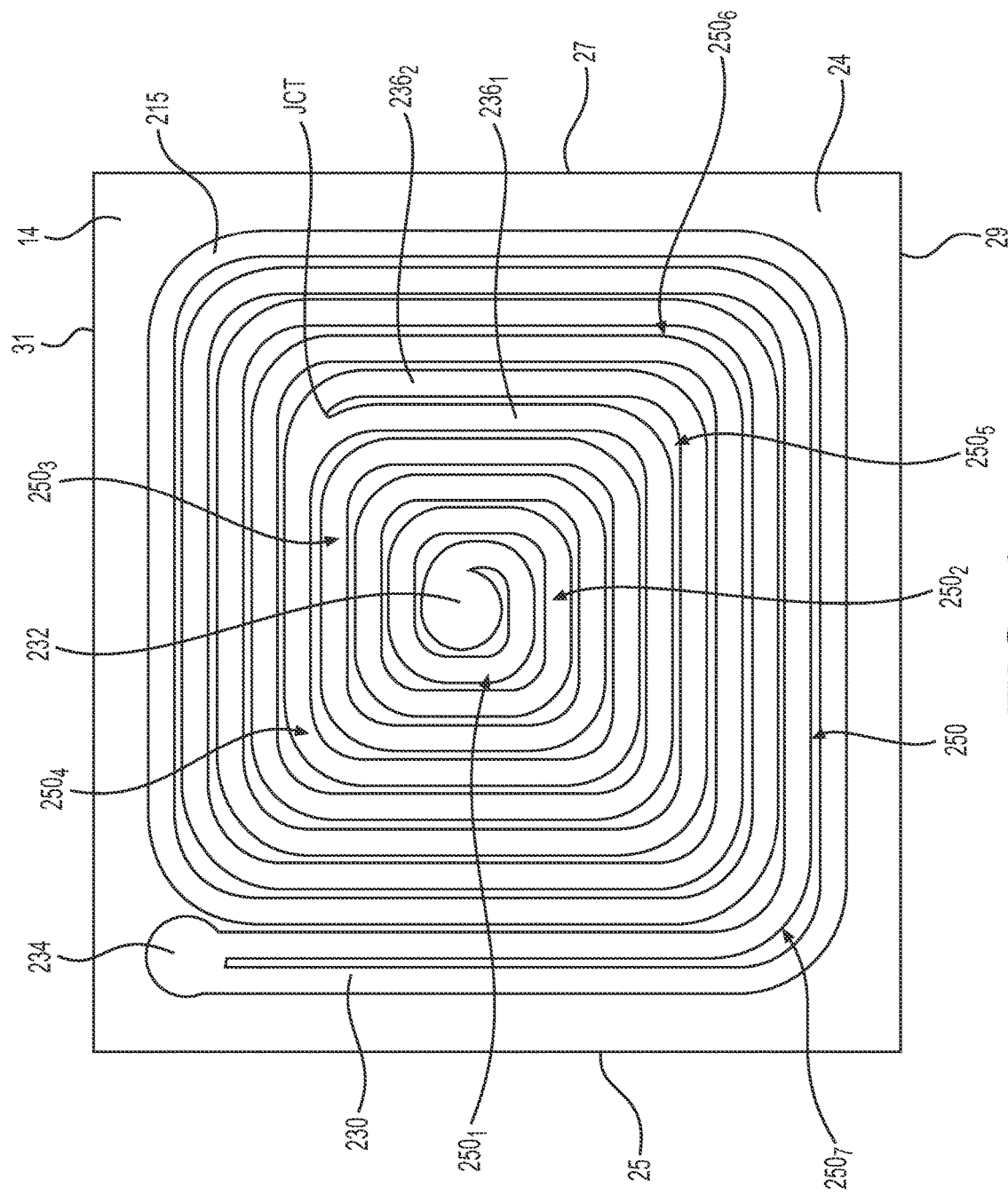
FIG. 9 is a top plan view of the base of the thermal transfer device in accordance with a variant of the embodiment of FIG. 5.

Furthermore, it is contemplated that, in alternative embodiments, the junction at which the fluid conduit 230 branches into the two channels $236_1$, $236_2$ could be at a location other than the inlet 232. For example, as shown in FIG. 9, the fluid conduit 230 could branch into the two channels $236_1$, $236_2$ at a junction JCT downstream from the inlet 232 (i.e., a location, along the path of the fluid conduit 230, further from the inlet 232). This configuration may be advantageous to prioritize heat transfer at a given region of the fluid conduit 230. For instance, in such a configuration as that depicted in FIG. 9, heat transfer in the region from the inlet 232 to the junction JCT may be greater than in the remainder of the fluid conduit 230 while incurring some pressure drop in the water in this limited region of the fluid conduit 230 (since the water flow is not split into the two channels $236_1$, $236_2$ in this region). Similarly, it is contemplated that, in alternative embodiments, the junction at which the two channels $236_1$, $236_2$ merge together could be upstream from the outlet 234.

Each of the channels $236_1$, $236_2$ has a constant width (i.e., a distance between the opposite walls of each of the channels $236_1$, $236_2$ is uniform along a span thereof). In particular, in this embodiment, the width of each of the channels $236_1$, $236_2$ is 2 mm. In other embodiments, the width of the channels of each of the channels $236_1$, $236_2$ may be between 1 mm and 4 mm. The channels $236_1$, $236_2$ may have any other suitable dimensions in other embodiments, so long as it is convenient for the flow regime within the channels $236_1$, $236_2$ and easily machinable such as with a machine tool having a rotary cutter (e.g., a mill or a router).

The fluid conduit 230 forms a generally rectangular spiral path centered about the inlet 232. More specifically, the path of the fluid conduit 230 begins at the inlet 232 and extends further away from the inlet 232 as it revolves around the inlet 232. The spiral path of the fluid conduit 230 ends at the outlet 234 which is positioned at an outer periphery of the spiral path formed by the fluid conduit 230. In particular, the spiral path of the fluid conduit 230 is formed by ring sections $250_1$-$250_5$ of the fluid conduit 230. The ring sections $250_1$-$250_5$ are concentric about the inlet 232. The innermost ring section $250_1$ is closest to the inlet 232 and the outermost ring section $250_5$ is furthest form the inlet 232. In particular, the outlet 234 is located at the outermost ring section $250_5$. Since the outlet 234 is located generally at a corner of the rectangular water block 10, the spiral path of the fluid conduit 230 spreads across almost an entirety of the area of the water block 10 (i.e., the recess 215 in the upper surface 24 of the base 14 spans most of a length and a width of the base 14).

In this embodiment, the rectangular spiral path of the fluid conduit 230 is generally square (i.e., the length and width of the fluid conduit 230 are approximately similar). However, in some cases, the length of the spiral path of the fluid conduit 230 be greater than its width. This may better accommodate the rectangular shape of the CPU 105 (or other component to be cooled).

The spiral path of the fluid conduit 230 does not include many tight curves (i.e., the radius of curvature of most if not all curves is relatively large) which facilitates and speeds up machining of the recess 215 in the base 14. Moreover, the radius of curvature of the curves of the spiral path may increase in proportion to a distance of the curve relative to the inlet 232. That is, the further from the central inlet 232 a curve of the spiral path is, the greater its radius of curvature.

As in the previous embodiments, the fluid conduit 230 is defined by the cover 13 and the base 14 when the cover 13 and the base 14 are affixed to one another. Moreover, in this embodiment, the path of the fluid conduit 230 (including the path of each of the channels $236_1$, $236_2$) is defined by the base 14 independently of the cover 13. In other words, while the cover 13 defines part of the fluid conduit 230 (covering an open top thereof), the direction of the water flow within the fluid conduit 230 is defined by the recess 215 machined into the upper surface 24 of the base 14. For its part, the cover 13 has a lower flat surface that closes the open top of the recess 215 (except at the inlet 132 and the outlet 134).

Figure 6:
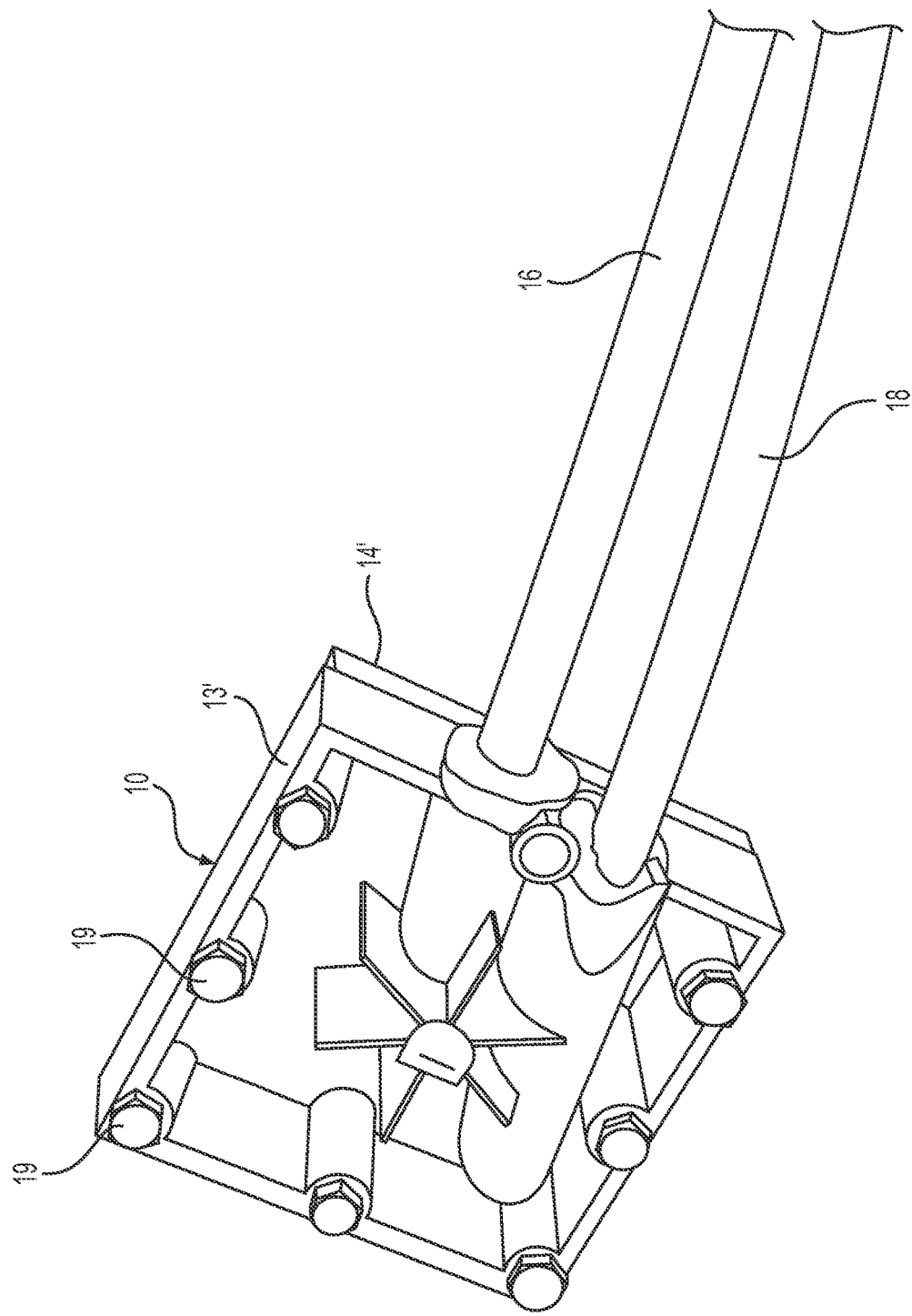
FIG. 6 is a perspective view of an embodiment of the thermal transfer device in which a cover of the thermal transfer device is screwed to the base.

In some embodiments, the cover and base may be affixed to one another differently. For instance, as shown in FIG. 6, a cover 13' and a base 14' are affixed to one another by fasteners 19 (e.g., screws). In such an embodiment, the cover 13' has holes extending therethrough for receiving the fasteners 19, and the base 14' has corresponding receiving openings (not shown) that are threaded to receive the fasteners 19. A sealing member (e.g., a gasket) may be received between the cover 13' and the base 14' to prevent leaks from within the fluid conduit (which can have any of the configurations discussed above with respect to the fluid conduits 30, 130, 230). Moreover, in this embodiment, the cover 13' is made of a polymeric material (the base 14' is still made of copper). For instance, the cover 13' may be an injection molded component. In this embodiment, the tubes 16, 18 are also made of polymeric material. A resin may seal the interface between the tubes 16, 18 and the cover 13'.

While the thermal transfer device 10 has been described above as being configured for absorbing heat from the target component 105, it is contemplated that, in alternative embodiments, the thermal transfer device 10 could be used for transferring heat to the target component 105 (in such a case, the target component is not a CPU).

The thermal transfer device 10 implemented in accordance with some non-limiting embodiments of the present technology can be represented as presented in the following numbered clauses.

CLAUSE 1. A thermal transfer device (10), comprising: a body (12) having a thermal transfer surface (20) configured to be placed in contact with a target component (105); a fluid conduit (230) defined in the body (12) and configured for conveying fluid through the body (12), the fluid conduit (230) being thermally coupled to the thermal transfer surface (20), the fluid conduit (230) having an inlet (232) and an outlet (234) wherein: the fluid conduit (230) forms a generally spiral path; the inlet (232) is positioned at a center of the spiral path; at a first junction, the fluid conduit (230) branches into at least two channels ($236_1$, $236_2$) extending generally parallel to one another throughout at least a majority of the span of the fluid conduit (230); and the at least two channels ($236_1$, $236_2$) merge at a second junction.

CLAUSE 2. The thermal transfer device of clause 1, wherein the first junction is the inlet (232) of the fluid conduit (230).

CLAUSE 3. The thermal transfer device of clause 1 or 2, wherein the second junction is the outlet (234) of the fluid conduit (230).

CLAUSE 4. The thermal transfer device of any one of clauses 1 to 3, wherein the spiral path is a generally square spiral path.

CLAUSE 5. The thermal transfer device of any one of clauses 1 to 4, wherein the outlet (234) is positioned at an outer periphery of the spiral path formed by fluid conduit (230).

CLAUSE 6. The thermal transfer device of any one of clauses 1 to 5, wherein a width of each of the at least two channels ($236_1$, $236_2$) is constant.

CLAUSE 7. The thermal transfer device of clause 6, wherein the width of each of the at least two channels ($236_1$, $236_2$) is between 1 mm and 4 mm inclusively.

CLAUSE 8. The thermal transfer device of any one of clauses 1 to 7, wherein: the body (12) comprises a first body portion (14) and a second body portion (13) affixed to the first body portion (14); the fluid conduit (230) is defined by the first and second body portions (14, 13); and a path of each of the at least two channels ($236_1$, $236_2$) is defined by the first body portion (14).

CLAUSE 9. The thermal transfer device of clause 8, wherein the inlet (232) and the outlet (234) are defined in the second body portion (13).

CLAUSE 10. The thermal transfer device of clause 8, wherein the first and second body portions (14, 13) are welded to one another.

CLAUSE 11. The thermal transfer device of any one of clauses 1 to 10 being a water block.

CLAUSE 12. The thermal transfer device of clause 11, wherein the water block is generally rectangular.

CLAUSE 13. A thermal transfer device (10), comprising: a body (12) having a thermal transfer surface (20) configured to be placed in contact with a target component (105); a fluid conduit (130) defined in the body (12) and configured for conveying fluid through the body (12), the fluid conduit (130) being thermally coupled to the thermal transfer surface (20), the fluid conduit (130) having an inlet (132) and an outlet (134), wherein: the fluid conduit (130) forms a serpentine path; at a first junction, the fluid conduit (130) branches into at least two channels ($136_1$, $136_2$) extending generally parallel to one another along the serpentine path formed by the fluid conduit (130); each of the at least two channels ($136_1$, $136_2$) defines a sinusoidal pattern along at least a majority of a span thereof; and the at least two channels ($136_1$, $136_2$) merge at a second junction.

CLAUSE 14. The thermal transfer device of clause 13, wherein the first junction is the inlet (132) of the fluid conduit (130).

CLAUSE 15. The thermal transfer device of clause 13 or 14, wherein the second junction is the outlet (134) of the fluid conduit (130).

CLAUSE 16. The thermal transfer device of any one of clauses 13 to 15, wherein: the serpentine path formed by the fluid conduit (130) defines a plurality of longitudinally-extending sections ($140_1$-$140_7$) that are parallel to one another and laterally spaced from one another; the plurality of longitudinally-extending sections ($140_1$-$140_7$) includes a first longitudinally-extending section ($140_1$) and a second longitudinally-extending section ($140_7$) that are laterally furthest-most of the longitudinally-extending sections ($140_1$-$140_7$); the first junction is located at the first longitudinally-extending section ($140_1$); and the second junction is located at the second longitudinally-extending section ($140_7$).

CLAUSE 17. The thermal transfer device of any one of clauses 13 to 16, wherein a width of each of the at least two channels ($136_1$, $136_2$) is constant.

CLAUSE 18. The thermal transfer device of clause 17, wherein the width of each of the at least two channels ($136_1$, $136_2$) is between 1 mm and 4 mm inclusively.

CLAUSE 19. The thermal transfer device of clause 13, wherein: the second junction is a first intermediate junction ($JCT_1$) downstream from the first junction; the fluid conduit (130) branches into an other at least two channels ($146_1$, $146_2$) at a second intermediate junction ($JCT_2$) between the first intermediate junction ($JCT_1$) and the outlet (134); between the first and second intermediate junctions ($JCT_1$, $JCT_2$), the fluid conduit (130) defines a plurality of longitudinally-extending sections ($145_1$-$145_3$) that are parallel to one another and laterally spaced from one another, the fluid conduit (130) having a single channel (155) extending along the longitudinally-extending sections ($145_1$-$145_3$); the longitudinally-extending sections ($145_1$-$145_3$) are substantially laterally centered between lateral ends of the body (12); the other at least two channels ($146_1$, $146_2$) merge at a fourth junction.

CLAUSE 20. The thermal transfer device of clause 19, wherein each of the other at least two channels ($146_1$, $146_2$) defines a sinusoidal pattern along at least a majority of a span thereof.

CLAUSE 21. The thermal transfer device of any one of clauses 13 to 20, wherein the serpentine path of the fluid conduit (130) extends from the inlet (132) to the outlet (134).

CLAUSE 22. The thermal transfer device of any one of clauses 13 to 19, wherein: the body (12) comprises a first body portion (14) and a second body portion (13) affixed to the first body portion (14); the fluid conduit (130) is defined by the first and second body portions (14, 13); and a path of each of the at least two channels ($136_1$, $136_2$) is defined by the first body portion (14).

CLAUSE 23. The thermal transfer device of clause 22, wherein the inlet (132) and the outlet (134) are defined in the second body portion (13).

CLAUSE 24. The thermal transfer device of clause 22, wherein the first and second body portions (14, 13) are welded to one another.

CLAUSE 25. The thermal transfer device of any one of clauses 13 to 22 being a water block.

CLAUSE 26. The thermal transfer device of clause 25, wherein the water block is generally rectangular.

CLAUSE 27. The thermal transfer device of clause 26, wherein the inlet (132) and the outlet (134) are generally located at diagonally opposite corners of the rectangular water block.

CLAUSE 28. The thermal transfer device of clause 26, wherein the inlet (132) and the outlet (134) are generally located at laterally opposite corners of the rectangular water block.

Modifications and improvements to the above-described embodiments of the present technology may become apparent to those skilled in the art. The foregoing description is intended to be exemplary rather than limiting. The scope of the present technology is therefore intended to be limited solely by the scope of the appended claims.

What is claimed is:

1. A thermal transfer device for a heat-generating electronic component, comprising:
   a body having a thermal transfer surface configured to be placed in contact with the heat-generating electronic component;
   a fluid conduit defined in the body and configured for conveying fluid through the body, the fluid conduit being thermally coupled to the thermal transfer surface, the fluid conduit having an inlet and an outlet, wherein:
   the fluid conduit forms a serpentine path;
   at a first junction, the fluid conduit branches into at least two channels extending generally parallel to one another along the serpentine path formed by the fluid conduit;
   each of the at least two channels defines a sinusoidal pattern along at least a majority of a span thereof;
   the at least two channels merge at a second junctions;
   at a third junction between the second junction and the outlet, the fluid conduit branches into another at least two channels;
   between the second junction and the third junction the fluid conduit defines a plurality of longitudinally-extending sections that are parallel to one another and laterally spaced from one another, the fluid conduit having a single channel extending along the longitudinally-extending sections; and
   the another at least two channels merge at a fourth junction.

2. The thermal transfer device of claim 1, wherein the first junction is the inlet of the fluid conduit.

3. The thermal transfer device of claim 1, wherein the fourth junction is the outlet of the fluid conduit.

4. The thermal transfer device of claim 1, wherein:
   the serpentine path formed by the fluid conduit defines a plurality of longitudinally-extending sections that are parallel to one another and laterally spaced from one another;
   the plurality of longitudinally-extending sections includes a first longitudinally-extending section and a second longitudinally-extending section that are laterally furthest-most of the longitudinally-extending sections;
   the first junction is located at the first longitudinally-extending section; and
   the fourth junction is located at the second longitudinally-extending section.

5. The thermal transfer device of claim 1, wherein a width of each of the at least two channels is constant.

6. The thermal transfer device of claim 5, wherein the width of each of the at least two channels is between 1 mm and 4 mm inclusively.

7. The thermal transfer device of claim 1, wherein:
   the second junction is a first intermediate junction downstream from the first junction; and
   the third junction is a second intermediate junction downstream from the second junction.

8. The thermal transfer device of claim 7, wherein each of the another at least two channels defines a sinusoidal pattern along at least a majority of a span thereof.

9. The thermal transfer device of claim 1, wherein the serpentine path of the fluid conduit extends from the inlet to the outlet.

10. The thermal transfer device of claim 1, wherein:
    the body comprises a first body portion and a second body portion affixed to the first body portion;
    the fluid conduit is defined by the first and second body portions; and
    a path of each of the at least two channels is defined by the first body portion.

11. The thermal transfer device of claim 10, wherein the inlet and the outlet are defined in the second body portion.

12. The thermal transfer device of claim 10, wherein the first and second body portions are welded to one another.

13. The thermal transfer device of claim 1, wherein the thermal transfer device is a water block.

14. The thermal transfer device of claim 13, wherein the water block is generally rectangular.

15. The thermal transfer device of claim 14, wherein the inlet and the outlet are generally located at diagonally opposite corners of the rectangular water block.

* * * * *